(12) United States Patent
Tervo et al.

(10) Patent No.: US 11,152,699 B2
(45) Date of Patent: Oct. 19, 2021

(54) METHOD, APPARATUS AND ARRANGEMENT FOR LINEARIZING OF A TRANSMITTER ARRAY

(71) Applicant: Nokia Technologies Oy, Espoo (FI)

(72) Inventors: Nuutti Tervo, Oulu (FI); Aarno Tapio Parssinen, Espoo (FI); Marko Leinonen, Oulu (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 16/767,390

(22) PCT Filed: Nov. 23, 2018

(86) PCT No.: PCT/EP2018/082366
§ 371 (c)(1),
(2) Date: May 27, 2020

(87) PCT Pub. No.: WO2019/110327
PCT Pub. Date: Jun. 13, 2019

(65) Prior Publication Data
US 2020/0395662 A1  Dec. 17, 2020

(30) Foreign Application Priority Data

Dec. 5, 2017 (GB) .................................... 1720236

(51) Int. Cl.
*H01Q 3/26* (2006.01)
*H01Q 3/36* (2006.01)
(Continued)

(52) U.S. Cl.
CPC ............... *H01Q 3/267* (2013.01); *H01Q 3/36* (2013.01); *H03F 1/3247* (2013.01); *H03F 3/245* (2013.01);
(Continued)

(58) Field of Classification Search
CPC combination set(s) only.
See application file for complete search history.

(56) References Cited

U.S. PATENT DOCUMENTS

| 2002/0034260 A1* | 3/2002 | Kim | H03F 1/3247 |
| | | | 375/296 |
| 2003/0156658 A1* | 8/2003 | Dartois | H03F 1/3294 |
| | | | 375/297 |

(Continued)

FOREIGN PATENT DOCUMENTS

WO    WO 2017/091119 A1    6/2017

OTHER PUBLICATIONS

Tervo, Nuutti, et al., "Digital Predistortion of Amplitute Varying Phased Array Utilising Over-the-Air Combining", © 2017 IEEE, 14 pgs.

(Continued)

*Primary Examiner* — Junpeng Chen
(74) *Attorney, Agent, or Firm* — Harrington & Smith (57) ABSTRACT

Method, apparatus and arrangement for linearizing of a transmitter array having a plurality of non-linear branches for transmitting into a predetermined direction, wherein the non-linear branches may purposively be made different to obtain varying responses of the non-linear branches over the transmitter array. A combined array response is determined via a feedback structure that models an array response to the predetermined direction and predistortion coefficients are determined based on the measured array response. A feedback circuit with a plurality of feedback branches can be used for feeding back individual response signals at the outputs of the non-linear branches through phase shift and attenuation units of the feedback branches, and for combining the response signals at the outputs of the feedback branches, wherein phase shift and attenuation of each feed- (Continued)

back branch is controlled to model a transmission channel of the individual response signals to a receiver in a predetermined direction.

20 Claims, 8 Drawing Sheets

(51) Int. Cl.
    *H03F 1/32*     (2006.01)
    *H03F 3/24*     (2006.01)
    *H04B 1/04*     (2006.01)
    *H04B 7/06*     (2006.01)

(52) U.S. Cl.
    CPC ......... *H04B 1/0483* (2013.01); *H04B 7/0617* (2013.01); *H03F 2200/451* (2013.01); *H04B 2001/0425* (2013.01)

(56) References Cited

U.S. PATENT DOCUMENTS

| | | | |
|---|---|---|---|
| 2015/0381220 A1* | 12/2015 | Gal | H04B 1/0475 375/296 |
| 2017/0244582 A1* | 8/2017 | Gal | H04L 25/03057 |
| 2020/0136706 A1* | 4/2020 | Lv | H04L 27/367 |

OTHER PUBLICATIONS

Rohde & Schwarz, "Influence of a directional coupler's parameters on the results of forward and reflected power measurements—White Paper", Sep. 24, 2015, 20 pgs.

* cited by examiner

METHOD, APPARATUS AND ARRANGEMENT FOR LINEARIZING OF A TRANSMITTER ARRAY

CROSS REFERENCE TO RELATED APPLICATION

This patent application is a U.S. National Stage application of International Patent Application Number PCT/EP2018/082366 filed Nov. 23, 2018, which is hereby incorporated by reference in its entirety, and claims priority to GB 1720236.7 filed Dec. 5, 2017.

FIELD OF THE INVENTION

The invention relates to the field of linearizing transmission systems with an array of transmitters, such as—but not limited to—digital predistortion for phased array transmitters.

BACKGROUND OF THE INVENTION

A transmitter array is a set of two or more transmitters with respective non-linear signal branches, wherein the signals from the signal branches of the transmitters are combined or processed to achieve improved performance over a single transmitter. The transmitter array can be used to increase the overall transmission gain, "steer" a transmission beam into a particular direction, "shape" it to have a certain spatial shape, or maximize the Signal to Interference Plus Noise Ratio (SINR). In phased-array transmitters or phased arrays, radio frequency signals from signal branches of transmitters of a transmitter array are fed to individual antennas with a correct phase relationship so that the radio waves from the separate antennas add together to increase the radiation in a desired direction, while cancelling to suppress radiation in other directions. The signal from the transmitters is fed to the antennas through devices called phase shifters, controlled by a computer system or other control system, which can alter the phase electronically, thus steering the beam of radio waves to a different direction. Since the array must consist of many small antennas (sometimes thousands) to achieve high gain, phased arrays are mainly practical at the high frequency end of the radio spectrum, in the microwave and especially millimetre-wave (mmW) bands, in which the antenna elements are conveniently small.

Phased array transmitters are becoming popular for mmW communications and are the emerging technology towards fifth generation (5G) communication networks. The envisioned data rates enabled by 5G communication networks sets major constraints for the linearity of the transmitters and their respective branches, as high data rates require also high linearity. Furthermore, radio frequency (RF) linearity is fundamentally linked with power-efficiency.

Moreover, future standards might require that adjacent channel power ratio (ACPR) specifications for an array are specified in terms of total radiated power (TRP). Any functional linearization scheme for arrays would help to meet the specified requirements or alternatively enable the array to operate closer to its saturation with better efficiency.

In the past, the linearity problem has been solved by linearizing the RF transmitters by using digital predistortion (DPD) techniques. Traditionally, DPD has been used to enable power amplifiers to operate close to compression, where the efficiency is maximized. However, traditional DPD techniques require that each RF transmitter is connected to an individual baseband chain, which is not the case with phased arrays, where the signal is divided to several parallel branches in RF domain. Hence, DPD of each individual RF branch is not possible with standard methods in phased arrays. Previously presented solutions even consider differences between the parallel branches as problems, which makes DPD challenging.

Conventional predistortion methods are mainly targeted on linearization of individual power amplifiers in the parallel transmitter branches to reduce the ACPR and to boost the efficiency of the power amplifiers under their back-off.

SUMMARY OF THE INVENTION

It is an object of the present invention to provide an improved linearization concept for transmitter arrays with a plurality of parallel branches.

This object is achieved by a method as claimed in claim 1 or 10, by an apparatus as claimed in claim 8, by an arrangement as claimed in claim 12, and by a computer program product as claimed in claim 19.

Accordingly, the directional behavior of nonlinearities in the individual branches of the transmitter array can be exploited by intentionally varying amplitude and/or phase characteristics of parallel transmitter branches to differ from each other. As a result, specifications for the non-linear branches of the array can be relaxed. The branches may thus differ from each other, whereas current methods require power amplifiers of the branches to be as similar as possible or to be tuned to be as similar as possible. This kind of tuning is done in production which consumes time and it is tedious to conduct in production for antenna array transmitters. By contrast, the proposed solution provides more freedom for radio design and component selection for the transmitters, since specifications for the amplifiers in the parallel branches can be relaxed to enable natural variation between amplifiers. Moreover, transmitter arrays can be linearized by a single predistortion input, while any signal amplitude differences over the nonlinear elements of the parallel branches can be utilized to enhance linearity of the transmitted signal to the predetermined direction. The difference can be made by purpose or may result from natural component variations.

As an additional advantage, the proposed solution enables significantly simpler predistortion models, as more complex phenomena are averaged out with high number of antennas and corresponding parallel non-linear branches with respective power amplifiers. Less coefficients means simpler algorithms and better performance for wideband signals, so that an extremely good error vector magnitude (EVM) to the beamforming direction can be achieved, while the total radiated adjacent channel power (TRACP) can be set to meet the specifications with correct analog power amplifier tuning. The TRACP is defined as a difference between adjacent channel power (ACP) and channel power, both integrated over the three-dimensional space.

Another advantage of the proposed invention is that it allows to shape the beam of the non-linearity and hence many different targets can be set for group linearization. In addition to the mentioned tradeoff between EVM and TRACP, the ACP can also be minimized in the directions in which the device under interference is being located. Furthermore, as the in-band distortion creates a notch in the predetermined direction which can be narrower than the actual beam shape, the security of the transmission is also enhanced, because the signal received in other directions than the intended one is distorted even more and hence would be harder to recover by other users and/or systems.

According to a first aspect, a method of linearizing a transmitter array having a plurality of non-linear branches for transmitting into a predetermined direction is provided, the method comprising: varying responses of individual non-linear branches over the transmitter array to increase variability of non-linearity of the non-linear branches in their output characteristics; determining predistortion coefficients based on a combined array response for the predetermined direction; and using the determined predistortion coefficients for applying predistortion to an input signal that is transmitted via the plurality of non-linear branches of the transmitter array.

It is noted that the combined response can be obtained by a predetermined look-up table or the like. It can be measured or modelled or the like. Additionally, the pre-determined look-up table can be modified and/or updated during the operation of the transmitter array. Alternatively, the combined array response maybe a combination of measurement results and pre-determined look-up table values.

Additionally, according to the first aspect, an apparatus is provided, which comprises: a branch control unit for varying responses of the non-linear branches over the transmitter array to increase variability of non-linearity of the non-linear branches in their output characteristics; a determination unit for determining a combined array response for the predetermined direction; a coefficient setting unit for determining predistortion coefficients based on the determined array response and for supplying the determined predistortion coefficients to a common predistortion unit for applying predistortion to the input signal that is transmitted via the plurality of non-linear branches of the transmitter array.

According to a first option of the first aspect, the varying may comprise at least one of providing different types or classes of amplifiers in the non-linear branches, providing phase shifters with phase-word dependent gains in the non-linear branches, varying bias points and/or input amplitudes and/or operational voltages of respective amplifiers in the non-linear branches to provide a mixture of compressing and expanding amplifiers in the non-linear branches, and providing different couplings between amplifiers and/or antennas of the non-linear branches.

According to a second option of the first aspect, which can be combined with the above first option, the varying may be adapted to provide a sufficient difference between the non-linear branches, that can be used for over-the-air linearization.

According to a third option of the first aspect, which can be combined with the above first or second option, the measuring may comprise feeding back individual response signals at the outputs of the non-linear branches via respective feedback branches of a feedback circuit, controlling phase shift and attenuation of each feedback branch to model a transmission channel of the individual response signals to a receiver in the predetermined direction, combining the response signals at the outputs of the feedback branches, and measuring the combined feedback signal.

According to a fourth option of the first aspect, which can be combined with any of the above first to third options, the determining may comprise applying least squares fitting to solve the predistortion coefficients. Of course, other suitable approaches for calculating predistortion coefficients can be applied as well. In adaptive array DPD, the coefficients may be solved also by adaptive filtering methods such as least mean squares (LMS), recursive least squares (RLS), Kalman-filtering, etc.

According to a fifth option of the first aspect, which can be combined with any of the above first to fourth options, the predetermined direction may not be an intended transmission direction. Thus, any other direction can be linearized as well, if it is desired for some reason (e.g. to reduce adjacent channel interference in some direction which may be different from the original beamforming direction). According to a sixth option of the first aspect, which can be combined with any of the above first or fifth options, the branch control unit may be adapted to control bias points and/or input amplitudes and/or operational voltages of respective amplifiers in the non-linear branches to provide a mixture of compressing and expanding amplifiers in the non-linear branches.

According to a second aspect which can be used for any type of transmitter array, a method of determining predistortion coefficients for a group linearization of a plurality of non-linear branches of a transmitter array is provided, the method comprising: feeding back individual response signals at the outputs of the non-linear branches via respective feedback branches of a feedback circuit; controlling phase shift and attenuation of each feedback branch to model a transmission channel of the individual response signals to a receiver in a predetermined direction; combining the response signals at the outputs of the feedback branches; and measuring the combined feedback signal to determine the predistortion coefficients for the group linearization.

Additionally, according to the second aspect, an arrangement is provided for determining predistortion coefficients for a group linearization of a plurality of non-linear branches of a transmitter array, the arrangement comprising: a feedback circuit comprising a plurality of feedback branches for feeding back individual response signals at the outputs of the non-linear branches through phase shift and attenuation units of the feedback branches, and for combining the response signals at the outputs of the feedback branches; a feedback control unit for controlling phase shift and attenuation of each feedback branch to model a transmission channel of the individual response signals to a receiver in a predetermined direction; and a measuring unit for measuring the combined feedback signal.

The proposed feedback approach and arrangement according to the second aspect even allows the use of conventional predistortion techniques while still significantly improving both linearity and efficiency of phased array transmitters. As a result, the power available from power amplifier arrays or their efficiency under back-off with modulated signals which have high peak-to-average-power ratio (PAPR) can be significantly improved.

According to a first option of the second aspect, the combining of the response signals may be done in the radio frequency domain.

According to a second option of the second aspect, which can be combined with the above first option, the feedback circuit may comprise a plurality of coupling elements for sampling the individual response signals before being fed back through the phase shift and attenuation units.

According to a third option of the second aspect, which can be combined with the above first or second option, the feedback control unit may be adapted to control the phase shift of each feedback branch to provide a phase value which has a negative sign compared to a phase value selected for a related one of the non-linear branches to steer a transmission beam of the transmitter array into the predetermined direction. Thus, the phase shift value in feedback is negative compared to the corresponding one in the phased array. Hence, as the complex coefficient of the corresponding branch can be expressed as complex number (i.e. $w_i = A_i e^{(-j \cdot phase^i)}$), the obtained coefficient becomes a complex conjugate compared with the corresponding branch in the phased array transmitter.

According to a fourth option of the second aspect, which can be combined with any one of the above first to third options, the feedback circuit may comprise a plurality of coupling elements at the outputs of the non-linear branches for separately measuring neighbour coupling and impedance matching effects. The coupling elements may be dual-directional couplers or other power coupling elements for feedback signal detection, such as a coupling capacitor, single direction coupler or a passive power division circuitry like Wilkinson power divider.

According to a third aspect, a transmitter array having a plurality of non-linear branches for transmitting into a predetermined direction may be provided, the transmitter array comprising at least one of an apparatus according to the above first aspect and an arrangement according to the above second aspect.

According to a fourth aspect, a mobile device for communicating with a wireless communication network may be provided, the mobile device comprising a transmitter array according the third aspect.

According to a fifth aspect, a radio access device for providing access to a wireless communication network may be provided, the radio access device comprising a transmitter array according to the third aspect.

According to a sixth aspect, a computer program product may be provided, which comprises code means for producing the steps of the methods of the first and second aspects, when it is run on a computer device.

It is noted that the above apparatus according to the first and seconds aspects may be implemented based on discrete hardware circuitries with discrete hardware components, integrated chips, or arrangements of chip modules, look-up table(s), or based on signal processing devices or chips controlled by software routines or programs stored in memories, written on a computer readable media, or downloaded from a network, such as the Internet.

It shall be understood that the method of claim 1 or 10, the apparatus of claim 8, the arrangement of claim 12, and the computer program product of claim 19 may have similar and/or identical preferred embodiments, in particular, as defined in the dependent claims.

It shall be understood that a preferred embodiment of the invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Embodiments of the present invention are now described based on digital predistortion (DPD) systems for a phased array transmitter, which can benefit from parametric variations over parallel power amplifiers (PAs) and which can be implemented in mobile devices or access devices of wireless communication systems.

Figure 1:
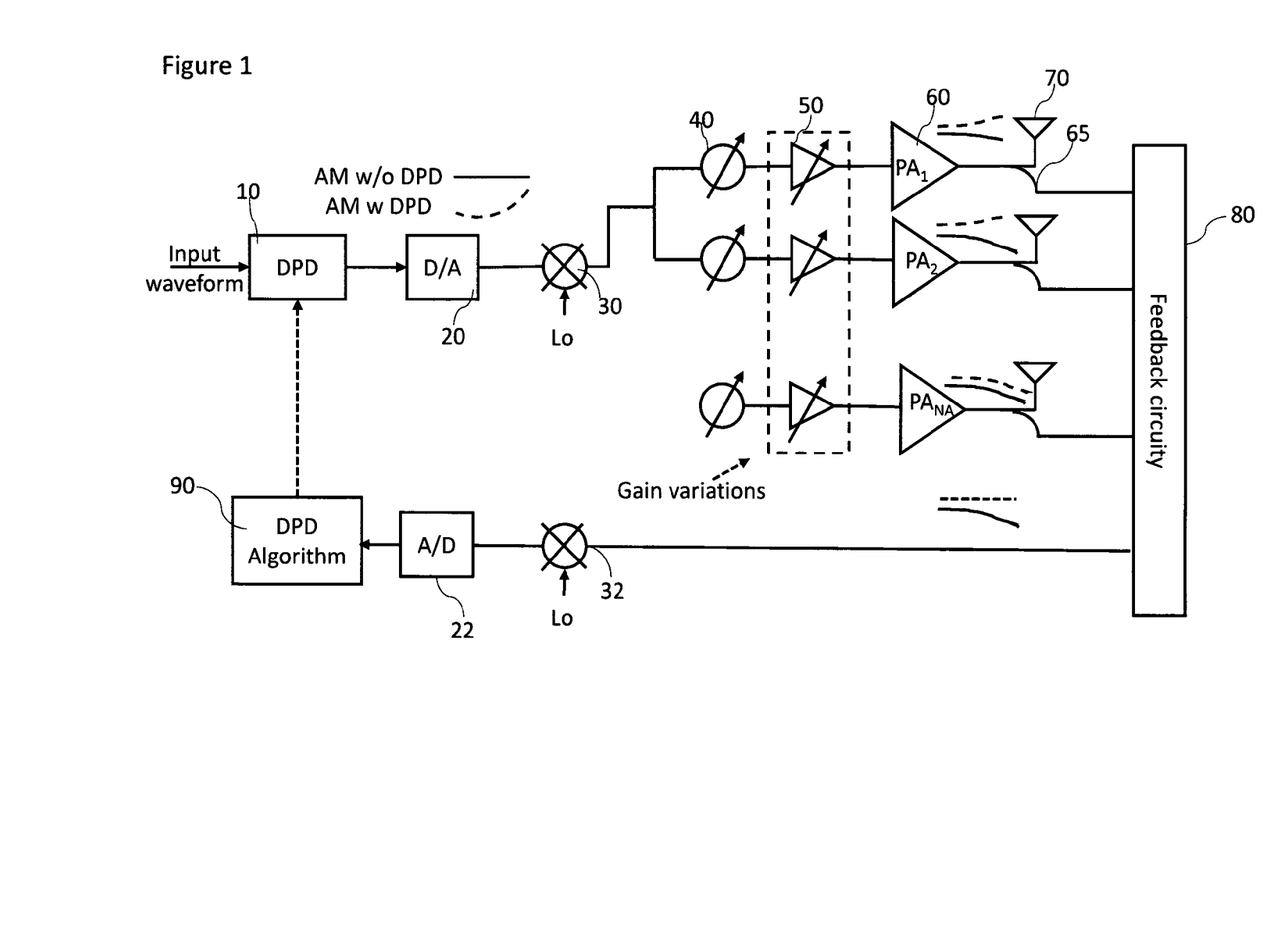
FIG. 1 shows a schematic block diagram of a predistortion system of a phased array transmitter according to a first embodiment.

FIG. 1 shows a schematic block diagram of a predistortion system of a phased array transmitter according to a first embodiment. It should be noted that digital signal processing and control parts of the system (e.g. for beamforming etc.) are omitted for clarity reasons.

A waveform of a single input signal is supplied to a DPD unit 10 which applies a digital predistortion to the input signal based on supplied DPD coefficients h and supplies the predistorted input signal to a digital-to-analog converter (D/A) 20, where it is converted to the analog domain before it is upconverted by a first mixer 30 with a local oscillator (LO) to the RF domain and supplied to a plurality of non-linear branches of the phased array transmitter. Each of the non-linear branches comprises a serial connection of a controllable phase shifter 40, a voltage controlled or variable gain amplifier (VGA) 50 and a PA 60. The outputs of the PAs 60 are connected to respective antenna elements 70 via respective coupling elements 65.

In an exemplary implementation, the antenna elements 70 may be patch antennas which has around 5 dBi of main lobe gain and the input signal may be a 100 MHz wide, 64-QAM (quadrature amplitude modulation) signal with raised cosine pulse shaping. It is however noted that any other suitable antenna structures and input signal modulations can be used as well.

According to the first embodiment, an array predistortion is applied by modelling and/or measuring the combining of nonlinearities in the beamforming direction by utilizing an array factor (e.g., a factor by which the directivity function of an individual antenna must be multiplied to get the directivity of the entire array) and solve the DPD coefficients based on a combined feedback output. This is achieved by a feedback receiver 80 to which samples of the respective branch output signals of the PAs 60 are supplied by the coupling elements 65. The feedback receiver 80 combines the sampled branch out signals and forwards a combined feedback signal in the RF domain to a second mixer 32 with local oscillator (LO), which down-converts the combined feedback signal to the baseband domain and supplies it to an analog-to-digital converter (A/D) 22. The digital output signal of the A/D converter 22 is input to a DPD calculation unit 90 which determines the DPD coefficients h for the DPD unit 10 based on the array factor. As an example, the DPD coefficients h may be solved by applying a least squares (LS) fitting.

The array behavior can be measured and modelled by sampling the PA outputs one by one and combining their response by utilizing the above mentioned array factor. As an alternative, a feedback structure could be used, which "mimics" the array factor summing the PA outputs in RF domain with negative phase shift values compared to the beamforming values As the input powers of individual PAs 60 are varied, e.g. by random or purposive control of the VGAs 50, they are compressing at different power levels. Thus, the predistortion is causing expansion for some of the PAs 60 which can compensate the compression of the other PAs 60 when the compressive-expansive behavior is combined over the air on the way to a receiver in a predetermined direction and the combining can be emulated by the set of controllable phase shifters 40. Thus, the phase shifters 40 in the feedback branch emulate the channel, while those signals that are finally received at the receiver are really combined over the air.

The phased-array transmitter needs to control a transmission power of the transmitter either during production or operation of the apparatus. One of the most common approaches is to use the VGAs 50 for this purpose. A power control algorithm controls the VGA operation to produce needed predetermined transmission power. Thus, the power control algorithm will control individual gains of the VGAs 50 to comply with a combined transmission power requirement. The power control algorithm may be combined with the DPD algorithm to optimize DPD performance.

Figure 2:
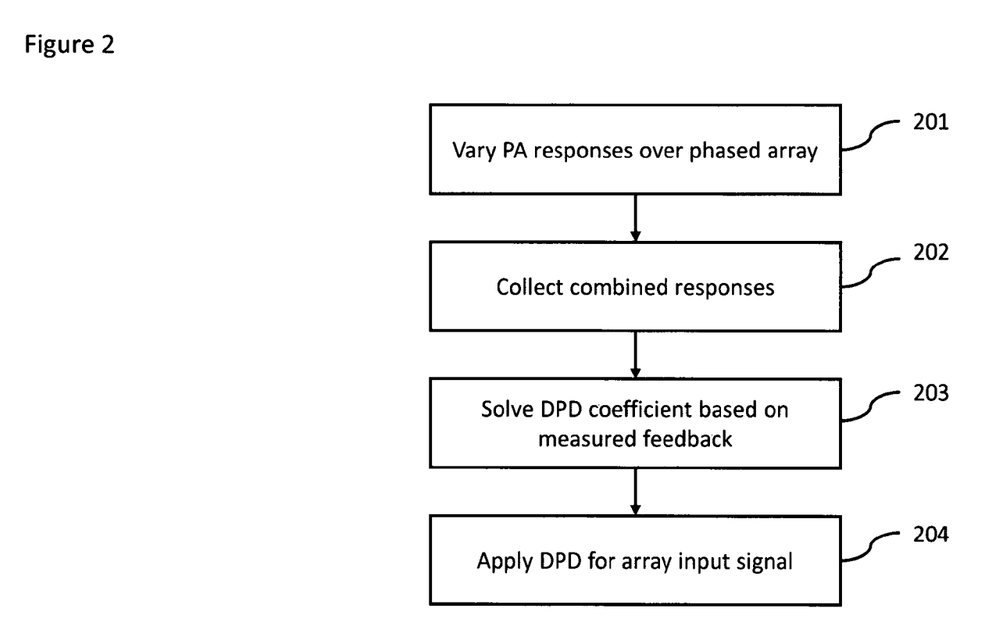
FIG. 2 shows a flow diagram of a predistortion procedure according to a second embodiment.

FIG. 2 shows a flow diagram of a predistortion procedure according to a second embodiment.

The second embodiment is directed to a linearization scheme for phased array transmitters which utilizes amplitude and/or phase variations over PA elements of parallel branches of a phased array transmitter to linearize the whole array with single DPD input by relatively simple DPD models. As already mentioned, a specific feedback structure (e.g. as explained later in connection with FIGS. 6 and 8) can be used to measure the array nonlinear behavior to the beamforming direction, or any direction which is to be linearized.

In step 201, the parallel PA responses are varied over the array by any suitable method. For example, their input amplitudes can be varied or their bias points can be varied, or there can be even different classes of PAs in the same array. Also, natural variations coming from the phase-word dependent gains of phase shifters or coupling between neighboring PAs or antennas can be used for this purpose.

Then, in step 202, the combined array response is collected by any possible feedback technique which models the array response to the predetermined direction, e.g. beamforming direction. An example of such feedback structure is described in the fourth embodiment with reference to FIG. 8.

In the following step 203, DPD coefficients are solved based on the measured feedback by any suitable method, such as simplified LS (least squares) fitting.

Finally, in step 204, digital predistortion is applied for the input signal which is transmitted with the phased array transmitter.

Figure 3:
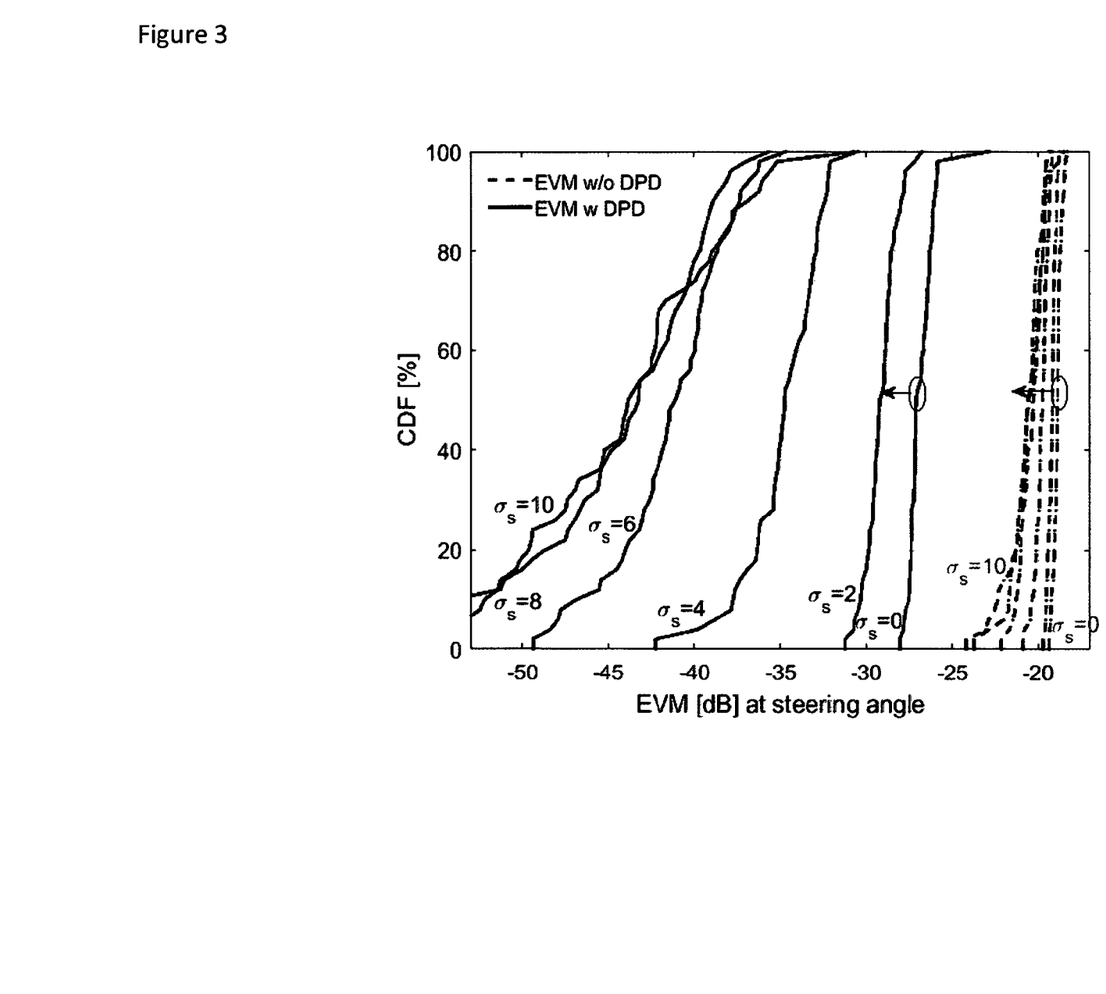
FIG. 3 shows a cumulative distribution function of a simulated EVM in the steering angle at different deviations of input powers with and without array predistortion.

FIG. 3 shows a cumulative distribution function of a simulated EVM in the steering angle at different deviations of input powers with and without array predistortion.

The EVM (sometimes also called receive constellation error (RCE) or modulation error ratio (MER)) is a measure used to quantify the performance of a digital radio transmitter or receiver. A signal sent by an ideal transmitter or received by a receiver would have all constellation points precisely at the ideal locations, however various imperfections in the implementation (such as carrier leakage, low image rejection ratio, phase noise etc.) cause the actual constellation points to deviate from the ideal locations. Informally, EVM is a measure of how far the points are from the ideal locations. Noise, distortion, spurious signals, and phase noise all degrade EVM, and therefore EVM provides a comprehensive measure of the quality of the radio receiver or transmitter for use in digital communications.

Figure 4:
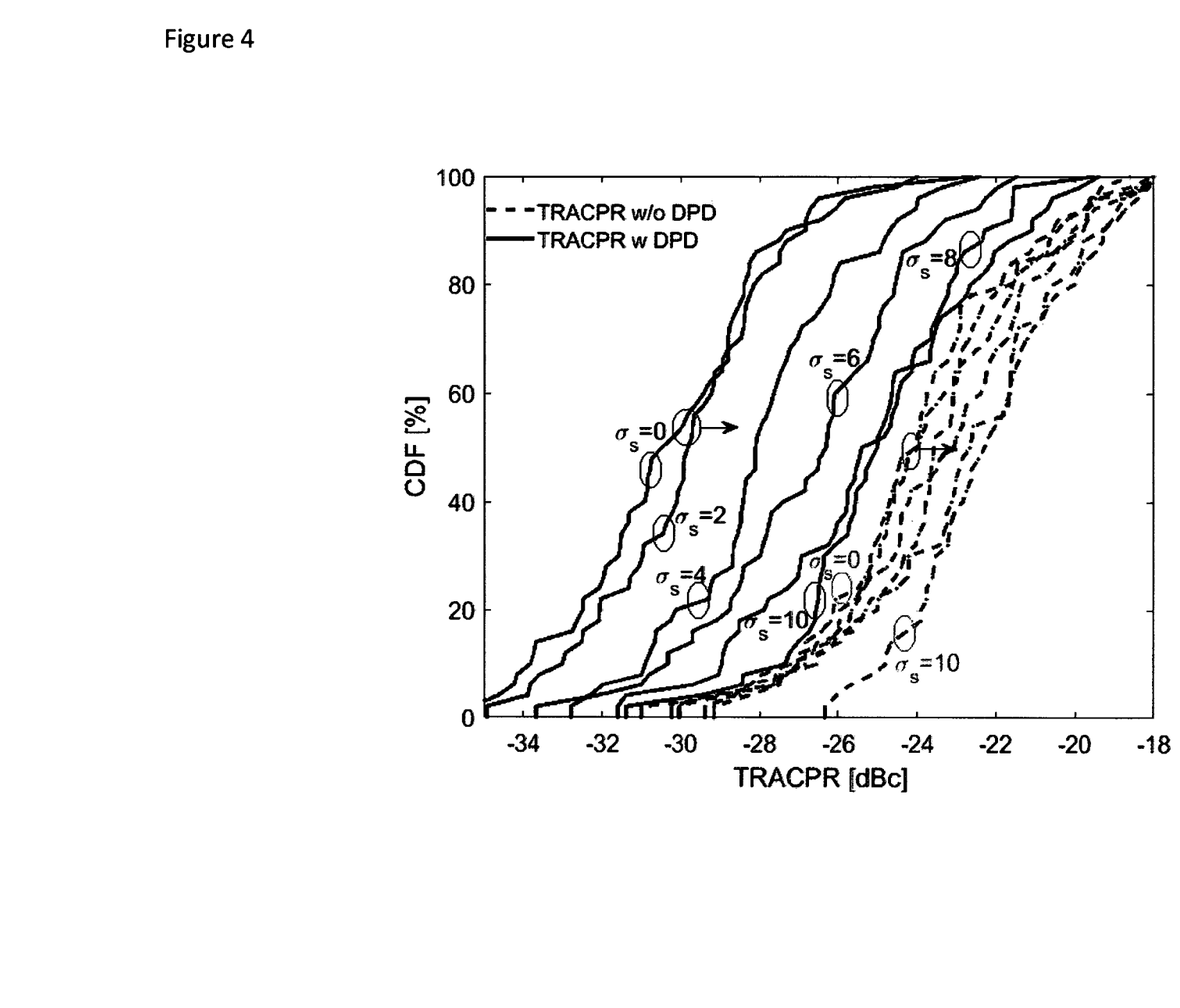
FIG. 4 shows a cumulative distribution function of a simulated total radiated adjacent channel power ration (TRACPR) at different deviations of input powers with and without array predistortion.

FIG. 4 shows a cumulative distribution function of a simulated TRACPR at different deviations of input powers with and without array predistortion.

Here, the input powers of the parallel PAs are assumed to follow normal distribution on a logarithmic scale with the mean of 0 dBm and standard deviation as dB. Simulations are performed by varying as $=\{0; 2; 4; 6; 8; 10\}$ dB and the number of antennas in a uniform linear array (ULA) ($Na=\{1; 2; 4; 8; 16; 32; 64; 128\}$). A Monte-Carlo simulation is repeated fifty times for each antenna configuration and $\sigma_s$. For each parameter set, the sum of the powers over the PAs is scaled in such a way that on average the PAs 60 are driven with 0 dBm of rms input power.

Cumulative distribution functions (CDFs) of the EVM observed in the beamforming direction for a 32-element ULA is shown in FIG. 4. Without the proposed DPD, the EVM increases only slightly with increase in the deviation of the input powers. When varying the inputs, the nonlinearities of individual PAs become less correlated, which averages part of the distortion out. However, with properly designed DPD, this effect can be significantly boosted, which can be seen in the CDFs with DPD in FIG. 4. The bigger the difference in the nonlinearities between the PAs, the better the EVM which can be potentially achieved in the array far field. Thus, by utilizing the proposed array predistortion, the overall array response is smoother as the PAs are partly cancelling each other and the linearization can be focused on the combined response.

Whereas the EVM results are improving when varying the PA input powers, TRACPR results are getting worse. Due to the fact that some of the PAs can potentially be driven even in saturation, the overall ACPR increases as we increase the variations. Only the correlated part of the out-of-band distortion can be linearized in terms of TRP. Thus, as the deviation over the PAs increases, the nonlinearities become less correlated, which decreases the TRACPR performance with and without DPD. However, TRACPR with DPD remains to be better than without DPD in all the scenarios. In practice, this means that the linearization strategy could be to improve TRACPR until some target and use the rest for improving the EVM in the predetermined direction to enable high data rates.

Figure 5:
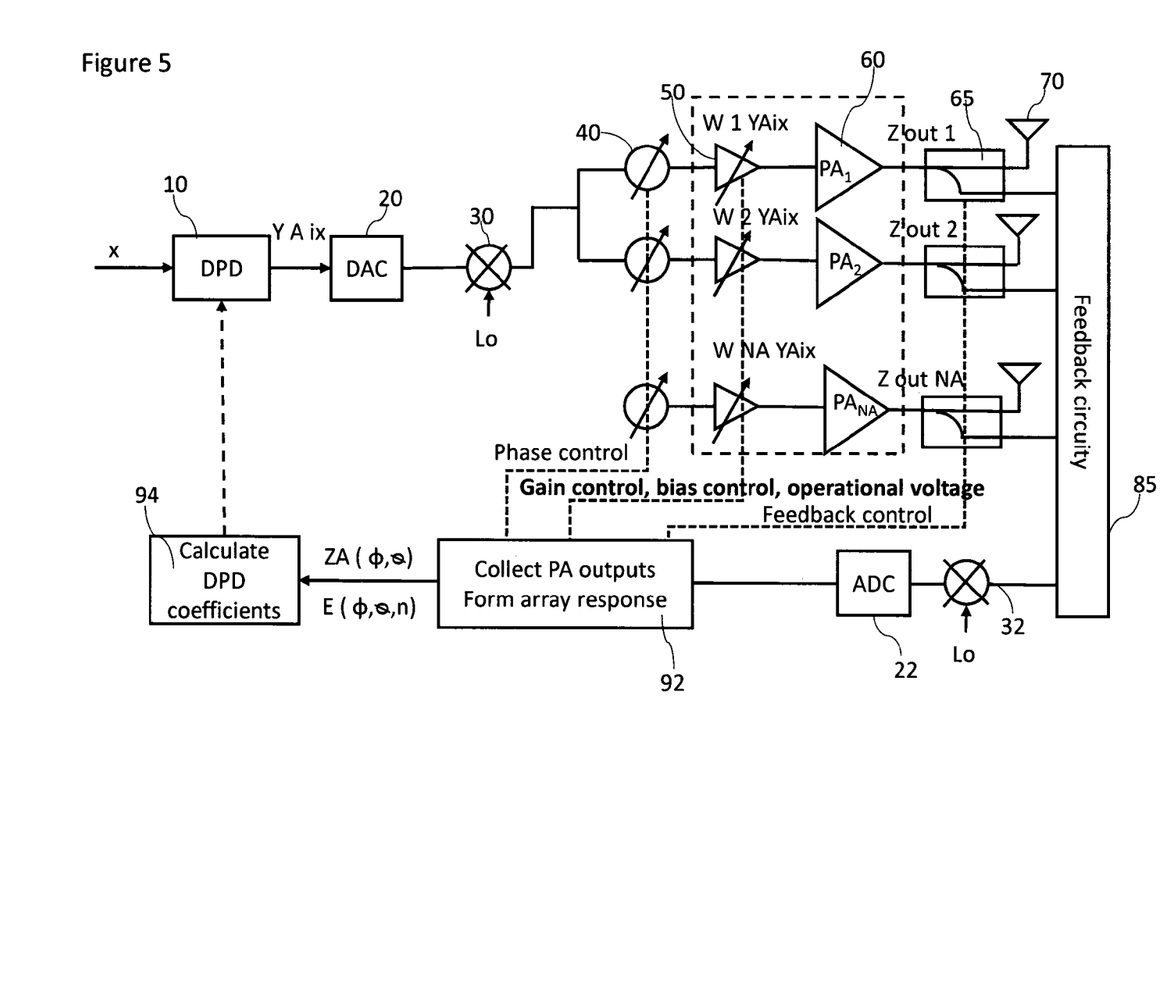
FIG. 5 shows a schematic block diagram of a predistortion system of a phased array transmitter according to a third embodiment.

FIG. 5 shows a schematic block diagram of a predistortion system of a phased array transmitter according to a third embodiment. Again, it should be noted that digital signal processing and control parts of the system (e.g. for beamforming etc.) are omitted for clarity reasons. Moreover, in view of the similarities between the block diagram of FIG. 1 and that of FIG. 5, identical parts are not explained again. Rather, it is referred to the description of FIG. 1.

The predistortion system of the third embodiment according to FIG. 5 comprises a control unit (e.g. a processor unit or the like) 92 which collects sampled outputs of the PAs 60 via a controllable attenuator element 85 and forms an array response in accordance with the array factor of the array antennas 70. Moreover, the control unit 92 provides control outputs for at least one of phase control of the controllable phase shifters 40, gain control of the VGAs 50, bias control of the PAs 60 and feedback control of the coupling elements 65 by the controllable attenuator element 85.

Thus, the control unit 92 may control the biases of the PAs 60 or input power level at PA inputs in analog domain to make them different enough, such that the compression of the combined response of all PAs 60 can be made smoother. As the combined response is measured with any existing feedback method (e.g. as in the fourth embodiment of FIG. 8) and DPD is applied by using the combined response, the DPD has an expansive shape. Hence, PAs which are less compressing can be controlled to expand, so that they can compensate the compression of other PAs which are operating closer to saturation. In other words, the PAs can be controlled to linearize each other without any actual analog linearization scheme.

More specifically, the control unit 92 of the predistortion system controls the beamforming coefficients of the controllable phased shifters 40, VGAs 50 (if used) and/or the PA bias points and/or operational voltages of the PAs 60. The phase shifter words are chosen such that the beam is steered to predetermined direction.

Then, the response of the PA array is measured at the control unit 92 to the predetermined direction based on any feedback technique and the combined PA response is utilized by a calculation unit 92 to solve the DPD coefficients h. Finally, a single DPD is applied by the DPD unit 10 to the input signal of the beamforming array transmitter.

If all PAs 60 were similar, i.e. if PA responses were not varied, the DPD would linearize all PAs 60 simultaneously and the operation of the DPD would be equivalent to a linearization of single PA. However, the PAs 60 are never exactly similar, i.e. there are always differences in the PA responses. The differences can come from natural component variations, phase-word dependent amplitude errors of the phase shifters 40, differences in bias points of the PAs 60, differences in operational voltages etc. The differences can be also made by purpose to be large enough that it can be utilize for over-the-air (OTA) linearization. Hence, any differences over the PA branches can be used to boost the linearity to the predetermined direction, as the common response can be fitted such that the PAs 60 can cancel each other to the beamforming direction. The more variations are introduced, the simpler the DPD model and implementation can be (i.e. less coefficients). This provides a powerful tool to fight against memory-effects and other phenomena which are challenging to linearize for wideband signals. As most of the more complex nonlinear effects will thus average out by large number of PAs by varying the PA responses in a smart way, the remaining part is relatively simple to linearize, even for wideband signals.

In practice, the array DPD adjustment should be adaptive also for different beamforming coefficients. In N. Tervo, J. Aikio, T. Tuovinen, T. Rahkonen and A. Pärssinen: "Digital predistortion of amplitude varying phased array utilising over-the-air combining," 2017 IEEE MTT-S International Microwave Symposium (IMS), Honololu, Hi., 2017, pp. 1165-1168, DPD has been adjusted to a predetermined direction in the 30° angle, and the steering angle of the array is varied ±10° away from the training direction. It can be seen that the proposed array DPD is still beneficial when the steering angle is around 5° different than the predetermined direction adjusted at the array DPD. Additionally, a diagram with a beam pattern in the array far field over the azimuth half plane with and without array predistortion is shown there. The proposed array DPD is not affected significantly by the shape of the main lobe of the transmitter array and hence only one channel power beam is presented. As expected, the side lobe level (SLL) is increased to −20 dBc compared to −30 dBc with a linear PA array. For illustrating the nonlinear behaviour of the array, adjacent channel powers (ACPs) in the array far field are calculated. The presented ACP is the maximum between lower (ACPL) and upper (ACPU) in each spatial direction. ACPs are observed to be direction dependent, especially if any amplitude variations between the PA branches are present. The proposed array DPD improves the ACP in the predetermined direction while it has not impact on beamforming itself, because it takes the beamforming direction into account.

It is however noted that, contrary to the present embodiments, the above publication relates to an "amplitude tapering" method where the variations are introduced for beamforming purposes only, but not for linearization purposes.

Figure 6:
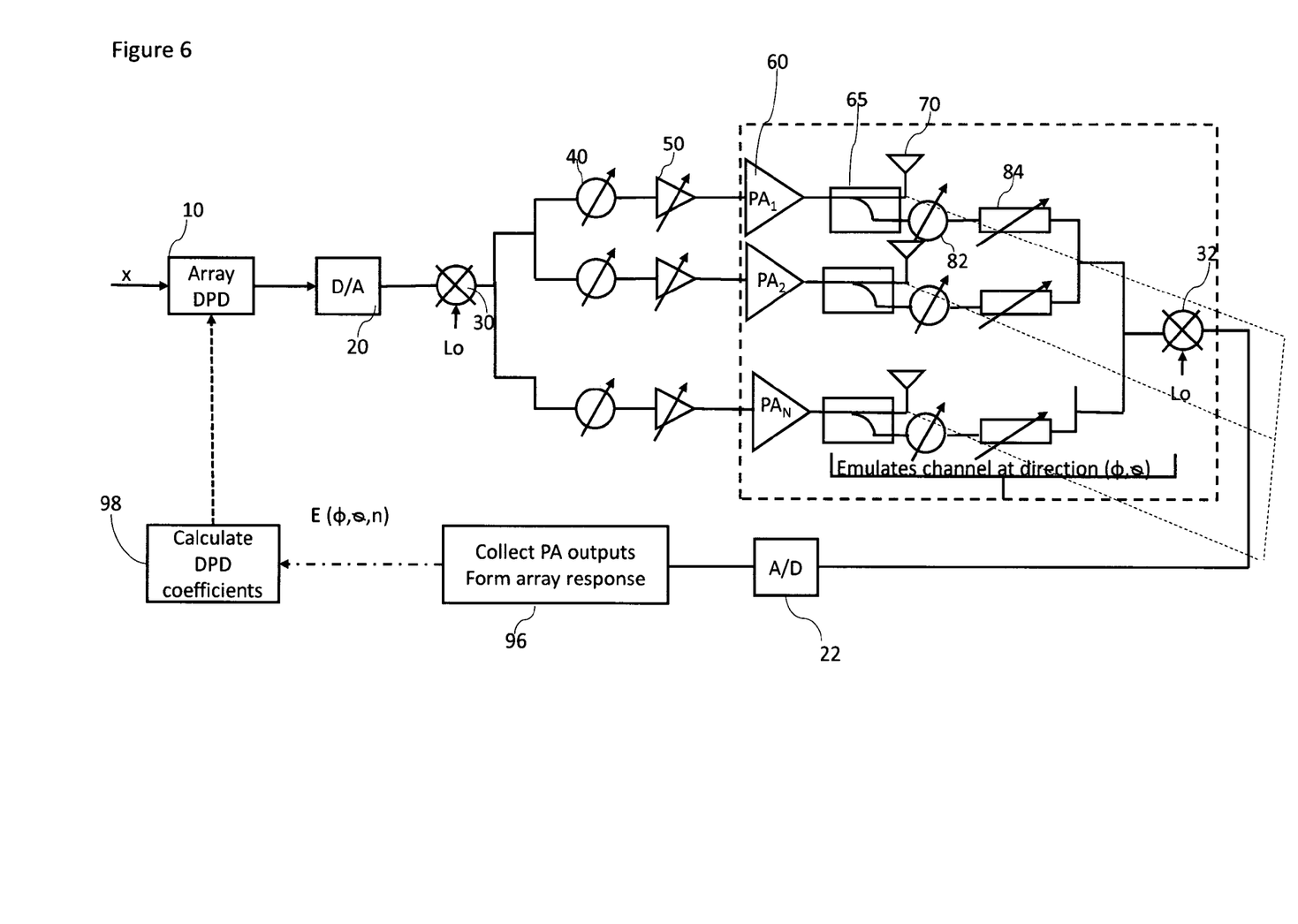
FIG. 6 shows a schematic block diagram of an array predistortion system with phased feedback according to a fourth embodiment.

FIG. 6 shows a schematic block diagram of an array predistortion system with phased feedback according to a fourth embodiment. Again, it should be noted that digital signal processing and control parts of the system (e.g. for beamforming etc.) are omitted for clarity reasons. Moreover, in view of the similarities between the block diagram of FIG. 1 and that of FIG. 6, identical parts are not explained again. Rather, it is referred to the description of FIG. 1.

In contrast to the first to third embodiments, the feedback architecture of the fourth embodiment enables to utilize conventional DPD techniques while still achieving a significant improvement of both linearity and efficiency of phased array transmitters. The PAs 60 are never exactly similar, i.e., there are always differences in the PA responses. This makes it challenging to linearize them as a group. Any differences over the PA branches can be used to boost the linearity in the predetermined direction as the common response can be fitted such that the distorting effects of the PAs 60 can cancel each other in the beamforming direction.

As the proposed feedback architecture sums the signal in RF domain as they would sum to the predetermined direction, the effects of PA differences are measured automatically by the feedback architecture. Hence, allowing the PA responses to vary over the array, even better EVM and ACPR results can be achieved in the predetermined direction with relatively simple DPD models, as many of the harmful nonlinear effects are known to average out in the feedback architecture as well as in the radio channel.

According to FIG. 6, individual responses at the respective outputs of the PAs 60 are sampled by coupling elements 65 and supplied to a feedback network which comprises a plurality of feedback branches with controllable phase shifters 82 and controllable attenuators 82. A feedback control unit (not shown) controls the controllable phase shifters 82 and the controllable attenuators 84 to apply phase shift and attenuation values for each feedback branch to emulate the channel to a receiver in the predetermined direction, i.e., to weight the PA outputs to model how they are transmitted to a certain spatial direction. The feedback branches are combined in the RF domain to model the combined array response to the beamforming direction, or to any direction where the array behavior is desired to be measured, which thus reflects the array factor of the phased array. The differences between the antenna elements, connected to each non-linear RF branch, can be introduced also for feedback branches by adjusting the controllable attenuators 82 of each feedback branch. Then, the combined array feedback signal is down-converted by the mixer 32 and converted to the digital domain by the A/D converter 22. The digital combined output signal is suppled to a collection unit 96 which collects the combined PA outputs and forms an array response which is supplied to a calculation unit 98 where the DPD coefficients h are calculated and supplied to the DPD unit 10.

Thus, in the predistortion system of the fourth embodiment, non-linear PA responses are spatially modelled for the phased array transmitter by combining the feedback signals obtained from the respective coupling elements 65 in the RF domain with correct phase shift values to emulate the radio channel to a receiver in the predetermined direction in the far-field. The proposed feedback architecture of FIG. 8 thus enables the use of simplified DPD schemes also for multiple parallel PAs.

It is thus possible to mimic the far-field behavior of the non-linearities with conducted measurements and hence allow the predistortion system to measure the nonlinear array pattern with any RF-beamformer at real time during the transmission. By using the proposed feedback network, a direction-dependent DPD of the beamforming array can be achieved. Thereby, a single input—single output (SISO) system for linearization is provided, since the array has only one input and only one combined feedback output. The inherent or purposive differences between the PA responses are combined in the feedback network as they would combine in the radio channel in beamforming direction and hence they are not required to be modelled separately.

The proposed feedback architecture according to the fourth embodiment may as well be used in combination with the array DPD techniques of the above first to third embodiments. The proposed phased feedback has only one output for the baseband (BB), which enables to utilize even standard DPD models such as Volterra series, Memory polynomial etc. for DPD. As the responses are combined in RF, no further processing is required over the PA branches which enables adaptive DPD for varying steering angles.

Figure 7:
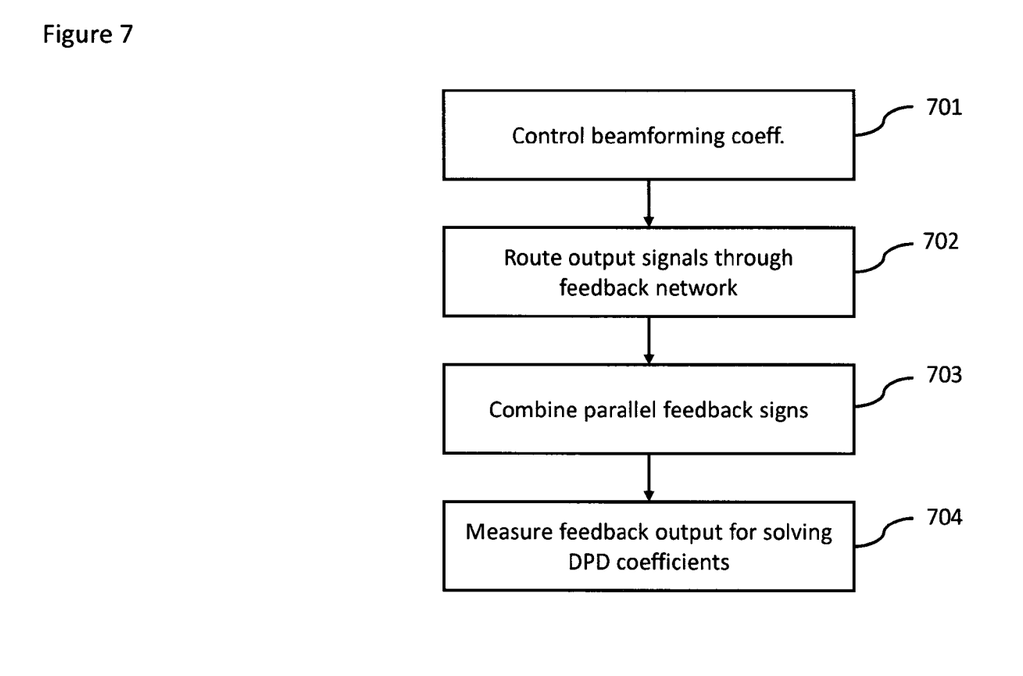
FIG. 7 shows a flow diagram of an array predistortion procedure with phased feedback according to a fifth embodiment.

FIG. 7 shows a flow diagram of an array predistortion procedure with phased feedback according to a fifth embodiment.

The phased feedback procedure according to the fifth embodiment starts with step 701, where beamforming coefficients of controllable phase shifters and VGAs (if used) (or any component used for changing the signal amplitude & phase) in the non-linear branches of the phased array transmitter are adjusted. More specifically, the phase shifter words are chosen such that the transmission beam of the phased array transmitter is steered to a predetermined direction.

Then, in step 702, the output signals of PAs of the non-linear branches are sampled e.g. by coupling elements as feedback signals and then routed through external phase shifters and attenuators. The phase values for the external phase shifters can be set to have negative sign compared with the phase shift values selected in step 701 in the simplest case when modelling a line-of-sight (LOS) channel.

In the following step 703, the parallel feedback signals are combined in the RF domain after phase shifting. The combined response thus emulates the channel behavior to the beamforming direction. Hence, the feedback signal is similar to the beamformed response of the array in the predetermined direction. The parallel nonlinearities are summed to the feedback signal as they would sum in the antenna array far field.

Finally, in step 704, the combined feedback signal is measured for solving the DPD coefficients of the phased array input.

The applied DPD procedure linearizes the whole array with single DPD polynomial. Hence, the transmitted signal from the phased array can be linearized to the predetermined direction.

Figure 8:
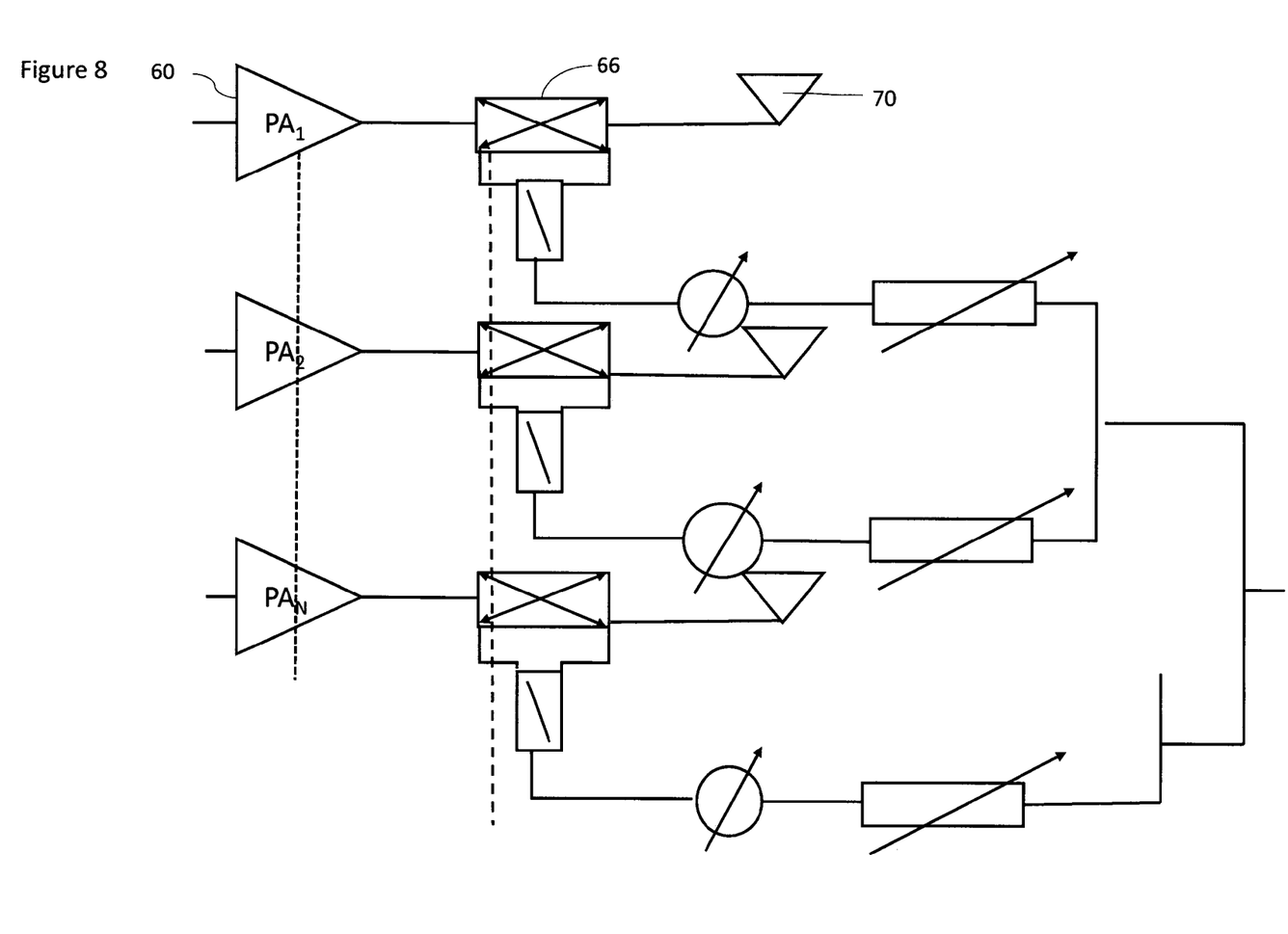
FIG. 8 shows a schematic block diagram of a switchable phased feedback architecture according to a sixth embodiment.

FIG. 8 shows a schematic block diagram of a switchable phased feedback architecture according to a fifth embodiment. The fifth embodiment enables to also measure the effects of mutual coupling and imperfect impedance matching and hence enables to handle harmful effects such as load pulling from neighboring PAs (PAs pull each other's impedance), but also to utilize such load pulling to improve efficiency of the PA array.

The phased feedback RF domain architecture of FIG. 8 corresponds to the feedback part only and can be combined with various transmitter arrays, such as the one of the previous embodiments. A dual-directional coupler 66 is connected to the output of the PAs 60 to allow direction-dependent sampling of signals at the output of the PAs. Additionally, a combined switch and phase shifter unit 86 provided in each feedback branch and connected to the two outputs of the respective dual-directional coupler 66. The combined switch and phase shifter unit 86 enables to us the transmitter array in different modes to combine different feedback signals via respective combiners 88. In a forward mode, the switched feedback architecture operates in the usual mode and samples the transmission output signals of the respective PAs 60 to their antenna elements. Additionally, in a reverse mode, the switched feedback architecture samples signals at the outputs of the respective PAs 60 in the opposite direction (i.e. reflections), so that the effects of imperfect impedance matching and adaptive load pulling from neighboring PAs can be measured separately. The switching function between the modes can be used to separate between forward and reverse feedback modes, so that the switchable phased feedback architecture according to a fifth embodiment can model both effects and apply them for DPD.

However, it is noted that the switching function of the switch and phase shifter unit 86 in FIG. 8 may also be replaced by two independent feedback circuitries, which allows to measure the effects of load pulling and/or impedance matching and/or forward array behavior simultaneously.

To summarize, a method, apparatus and arrangement for linearizing a transmitter array having a plurality of non-linear branches for transmitting into a predetermined direction have been described, wherein the non-linear branches may purposively be made different to obtain varying responses of the non-linear branches over the transmitter array. A combined array response is measured via a feedback structure that models an array response to the predetermined direction and predistortion coefficients are determined based on the measured array response. A feedback circuit with a plurality of feedback branches can be used for feeding back individual response signals at the outputs of the non-linear branches through phase shift and attenuation units of the feedback branches, and for combining the response signals at the outputs of the feedback branches, wherein phase shift and attenuation of each feedback branch is controlled to model a transmission channel of the individual response signals to a receiver in a predetermined direction. Thereby, a linearization scheme can be provided, which utilizes variations over the non-linear branches to linearize the whole array with single predistortion input.

While the invention has been illustrated and described in detail in the drawings and foregoing description, such illustration and description are to be considered illustrative or exemplary and not restrictive. The invention is not limited to the disclosed embodiments and can be applied to any type of transmitter array with a plurality of non-linear branches.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

A single unit or device may fulfill the functions of several items recited in the claims. The mere fact that certain measures are recited in mutually different dependent claims does not indicate that a combination of these measures cannot be used to advantage.

The described procedures like those indicated in FIGS. 2 and 7 can be implemented as program code means of a computer program and/or as dedicated hardware. The computer program may be stored and/or distributed on a suitable medium, such as an optical storage medium or a solid-state medium, supplied together with or as part of other hardware, but may also be distributed in other forms, such as via the Internet or other wired or wireless telecommunication systems.

The invention claimed is:

1. A method, the method comprising:
   varying responses of individual ones of a plurality of non-linear branches over a transmitter array to increase variability of non-linearity of the non-linear branches in their output characteristics;
   determining predistortion coefficients based on a combined array response for a predetermined direction into which a beam will be transmitted using the transmitter array; and
   using the determined predistortion coefficients for applying predistortion to an input signal that is transmitted via the plurality of non-linear branches of the transmitter array into the predetermined direction.

2. The method according to claim 1, wherein the varying comprises at least one of:
   providing different types or classes of amplifiers in the non-linear branches,
   providing phase shifters with phase-word dependent gains in the non-linear branches,
   varying bias points and/or input amplitudes and/or gains of amplifier blocks and/or operational voltages of respective amplifiers in the non-linear branches to provide a mixture of compressing and expanding amplifiers in the non-linear branches, or
   providing different couplings between amplifiers and/or antennas of the non-linear branches.

3. The method according to claim 1, further comprising measuring a combined array response via a feedback structure that models an array response to the predetermined direction.

4. The method according to claim 1, wherein the varying is adapted to provide a sufficient difference between the non-linear branches, that can be used for over-the-air linearization.

5. The method according to claim 1, wherein the measuring comprises feeding back individual response signals at the outputs of the non-linear branches via respective feedback branches of a feedback circuit, controlling phase shift and attenuation of each feedback branch to model a transmission channel of the individual response signals to a receiver in the predetermined direction, combining the response signals at the outputs of the feedback branches, and measuring the combined feedback signal.

6. The method according to claim 1, wherein the predetermined direction is not an intended transmission direction.

7. The method according to claim 1, wherein the determining comprises applying least squares fitting and/or adaptive methods comprising at least one of:
   least mean squares,
   recursive least squares, or
   Kalman-filtering to solve the coefficients.

8. A computer program product comprising a non-transitory computer readable medium having code configured to cause the steps of claim 1, when the code is run on a computer device.

9. The method of claim 1, wherein the determining predistortion is performed at least by fitting the combined array response so distorting effects of at least some of the non-linear branches cancel each other in the beamforming direction.

10. The method of claim 1, wherein individual ones of the plurality of non-linear branches comprise a power amplifier, and the applying predistortion causes some power amplifiers in their non-linear branches to have more expansive outputs that compensate for other power amplifiers in other non-linear branches that have compressed outputs.

11. An apparatus comprising:
    branch control circuitry configured to vary responses of individual ones of a plurality of non-linear branches over a transmitter array to increase variability of non-linearity of the non-linear branches in their output characteristics;
    circuitry configured to determine a combined array response in a predetermined direction into which a beam will be transmitted using the transmitter array,
    coefficient setting circuitry configured to determine predistortion coefficients based on the determined array response and for supplying the determined predistortion coefficients to a common predistortion unit for applying predistortion to an input signal that is transmitted via the plurality of non-linear branches of the transmitter array into the predetermined direction.

12. The apparatus according to claim 11, wherein the branch control circuitry is adapted to control bias points and/or input amplitudes and/or gains of amplifier blocks and/or operational voltages of respective amplifiers in the non-linear branches to provide a mixture of compressing and expanding amplifiers in the non-linear branches.

13. The apparatus of claim 11, comprising a mobile device for communicating with a wireless communication network, the mobile device comprising the transmitter array.

14. The apparatus of claim 11, comprising a radio access device for providing access to a wireless communication network, the radio access device comprising the transmitter array.

15. A method comprising:
feeding back individual response signals at outputs of a plurality of non-linear branches of a transmitter array via respective feedback branches of a feedback circuit;
controlling phase shift and attenuation of each feedback branch to model a transmission channel of the individual response signals to a receiver in a predetermined direction,
combining the response signals at the outputs of the feedback branches; and
determining a combined feedback signal to calculate predistortion coefficients for group linearization, wherein the predistortion coefficients are calculated to vary responses of individual ones of the non-linear branches to increase variability of non-linearity of the non-linear branches in their output characteristics.

16. The method according to claim 15, wherein the combining of the response signals is done in the radio frequency domain.

17. The arrangement according to claim 16, wherein the feedback circuit comprises a plurality of coupling elements at the outputs of the non-linear branches for separately measuring neighbor coupling and impedance matching effects.

18. An arrangement comprising:
a feedback circuit comprising a plurality of feedback branches for feeding back individual response signals at the outputs of a plurality of non-linear branches of a transmitter array through phase shift and attenuation circuitry of the feedback branches, and for combining the response signals at the outputs of the feedback branches;
feedback control circuitry configured to control phase shift and attenuation of each feedback branch to model a transmission channel of the individual response signals to a receiver in a predetermined direction; and
measuring circuitry configured to measure a combined feedback signal to calculate predistortion coefficients for group linearization, wherein the predistortion coefficients are calculated to vary responses of individual ones of the non-linear branches to increase variability of non-linearity of the non-linear branches in their output characteristics.

19. The arrangement according to claim 18, wherein the feedback circuit comprises a plurality of coupling elements for sampling the individual response signals before being fed back through the phase shift and attenuation circuitry.

20. The arrangement according to claim 18, wherein the feedback control circuitry is adapted to control the phase shift of each feedback branch to provide a phase value which has negative sign compared to a phase value selected for a related one of the non-linear branches to steer a transmission beam of the transmitter array into the predetermined direction.

* * * * *